(12) United States Patent
Lee

(10) Patent No.: US 6,563,367 B1
(45) Date of Patent: May 13, 2003

(54) INTERCONNECTION SWITCH STRUCTURES

(75) Inventor: Andy L. Lee, San Jose, CA (US)

(73) Assignee: Altera Corporation, San Jose, CA (US)

(*) Notice: Subject to any disclaimer, the term of this patent is extended or adjusted under 35 U.S.C. 154(b) by 0 days.

(21) Appl. No.: 09/930,863

(22) Filed: Aug. 16, 2001

Related U.S. Application Data

(60) Provisional application No. 60/225,585, filed on Aug. 16, 2000.

(51) Int. Cl.$^7$ ............................................. H03K 17/16
(52) U.S. Cl. ............................................. 327/390
(58) Field of Search ............................... 327/382, 390, 327/427, 530, 534

(56) References Cited

U.S. PATENT DOCUMENTS

| | | | | |
|---|---|---|---|---|
| 4,821,233 A | | 4/1989 | Hsieh | 365/203 |
| 4,831,596 A | * | 5/1989 | Tran | 327/390 |
| 5,119,337 A | * | 6/1992 | Shimizu et al. | 327/534 |
| RE34,363 E | | 8/1993 | Freeman | 307/465 |
| 5,291,079 A | | 3/1994 | Goetting | 307/465 |
| 5,574,634 A | | 11/1996 | Parlour et al. | 363/59 |
| 5,783,962 A | * | 7/1998 | Rieger | 327/383 |
| 6,307,420 B1 | * | 10/2001 | Zhou | 327/390 |
| 6,396,325 B2 | * | 5/2002 | Goodell | 327/308 |

OTHER PUBLICATIONS

APEX 20K Programmable Logic Device Family, Data Sheet, Mar. 2000, ver. 2.06, Altera Corporation, pp. 1–208.
FLEX 8000 Programmable Logic Device Family, Data Sheet, Jun. 1999, ver. 10.01, Altera Corporation, pp. 349–410.
FLEX 10K Embedded Programmable Logic Family, Data Sheet, Jun. 1999, ver. 4.01, Altera Corporation, pp. 1–137.
XC3000 Series Field Programmable Gate Arrays (XC3000A/L, XC3100A/L), Product Description, Nov. 9, 1998, ver. 3.1, Xilinx, Inc., pp. 7–3 through 7–78.

* cited by examiner

Primary Examiner—Jeffrey Zweizig
(74) Attorney, Agent, or Firm—Fish and Neave; Robert R. Jackson; Jeffrey C. Aldridge

(57) ABSTRACT

An improved interconnection switch using NMOS passgates is presented which allows the gate voltage of the NMOS passgate to be bootstrapped to a higher voltage than the initial voltage applied thereon so as to allow a higher logic HIGH signal to be passed. The stimulus for this bootstrapping is the transition of the logic signal at the input terminal of the NMOS passgate, which obviates the need for a separate external stimulus. Because the bootstrapping occurs as a result of the dynamic coupling between the gate terminal and the channel of the NMOS passgate, the voltage across the gate oxide does not exceed the magnitude of the logic HIGH signal, thereby rendering the use of thick-oxide devices unnecessary.

21 Claims, 3 Drawing Sheets

US 6,563,367 B1

INTERCONNECTION SWITCH STRUCTURES

CROSS REFERENCE TO RELATED APPLICATION

This claims the benefit of U.S. Provisional Patent Application No. 60/225,585, filed Aug. 16, 2000.

BACKGROUND OF THE INVENTION

This invention relates to integrated circuit devices, and more particularly to the interconnection switches that may be used in such devices.

One of the most commonly-used type of interconnection switch is the single-transistor NMOS passgate. A typical NMOS passgate acts as a switch by selectively "passing" a signal between its source and drain terminals, depending on whether the potential difference between its gate terminal, $V_{GATE}$, and its source terminal, $V_{SOURCE}$, exceeds the threshold voltage, $V_t$. (As is well-known in the art, there is no physical difference between the "source" and "drain" terminals of an MOS device; the source terminal of an NMOS transistor is the terminal having the lower voltage.) When $V_{GATE}-V_{SOURCE}$ is less than $V_t$, the NMOS passgate is in the "cutoff" state, thereby acting as an "open" switch; when $V_{GATE}-V_{SOURCE}$ is greater than $V_t$, the NMOS passgate is in the conduction state, thereby acting as a "closed" switch. Accordingly, a ceiling is imposed on the output of an NMOS passgate in that it cannot exceed $V_{GATE}-V_t$ (since the NMOS passgate starts to enter the "cutoff" mode when $V_{GATE}-V_{SOURCE}$ approaches $V_t$). For example, when $V_{GATE}$ and a logic HIGH signal to be passed by an NMOS passgate both correspond to the positive supply level, $V_{DD}$, the signal that may be passed is limited to $V_{DD}-V_t$. (As is well-known in the art, $V_t$ is not a discrete value for an MOS transistor; it may be considered a range of values that is influenced by a variety of second-order effects, such as substrate bias and subthreshold conduction. However, in order to simplify the illustration of the principles of the present invention, $V_t$ will be discussed herein as if it is a discrete value rather than a range of values.)

This limit on the logic HIGH level that may be passed by an NMOS passgate renders it problematic for use in integrated circuit devices where the operating voltages (e.g., supply voltages, bias voltages, etc.) may be low enough such that $V_{GATE}-V_t$ may correspond to a voltage that would not be recognized as a logic HIGH signal. With the current trend in using ever-lower operating voltages, which are nearing levels comparable to $V_t$, the ability of single-transistor NMOS passgate structures to reliably pass logic HIGH levels becomes more difficult in view of the influence $V_t$ exerts on the logic levels that may be propagated.

SUMMARY OF THE INVENTION

The present invention relates to an improved design for interconnection switches that use NMOS passgates. An improved interconnection switch that may be constructed in accordance with the principles of the present invention includes bootstrapping circuitry that allows the gate voltage of an NMOS passgate to be boosted to a higher voltage so as to increase the effective $V_{GATE}$, thereby raising the $V_{GATE}-V_t$ limit imposed on the logic HIGH signals that may be passed. The stimulus for this bootstrapping is the transition of the logic signal at the input terminal of the NMOS passgate, thereby obviating the need for a separate external stimulus. Because the bootstrapping occurs as a result of the dynamic coupling between the gate terminal and the channel of the NMOS passgate, the voltage across the gate oxide does not exceed the magnitude of the logic HIGH signal, thereby rendering the use of thick-oxide devices unnecessary.

Further features of the invention, its nature and various advantages will be more apparent from the accompanying drawings and the following detailed description of the invention.

DETAILED DESCRIPTION OF THE INVENTION

Figure 1:
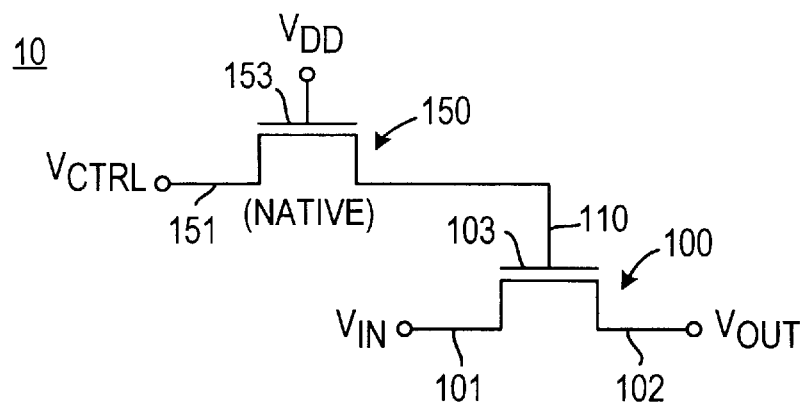
FIG. 1 is an improved interconnection switch that may be constructed in accordance with the principles of the present invention.

FIG. 1 shows one embodiment of an improved interconnection switch 10 which may be constructed in accordance with the principles of the present invention. Interconnection switch 10, which may be turned "on" or "off" depending on a single control signal, $V_{CTRL}$, includes an NMOS pass transistor 100 coupled to a "native" n-channel transistor 150, which, as will be described below, may be used to assist in bootstrapping the voltage on gate 103 of NMOS pass transistor 100 to a voltage higher than $V_{CTRL}$. ("Native"-channel devices, which are available in most semiconductor fabrication processes, are transistors with positive threshold voltages that are close to zero volts).

For the purposes of the present invention, $V_{CTRL}$ may be provided by any of a variety of sources such as a programmable RAM bit, a bias voltage (which may be generated internally or supplied externally, and which may or may not correspond to the supply voltage), or an internally-generated logic signal (which may be static or dynamic). For the purpose of simplifying the discussion of the principles of the present invention, the logic HIGH and LOW signals referred to herein will correspond to the positive and negative supply voltages, $V_{DD}$ and $V_{SS}$, respectively. However, it will be appreciated by one skilled in the art that the principles of the present invention are fully applicable to embodiments in which the logic HIGH and LOW values do not correspond to the supply voltages, or here a variety of different biasing and supply voltages are used.

As illustrated in FIG. 1, NMOS pass transistor 100 and "native" n-channel transistor 150 are connected such that $V_{CTRL}$ is provided to the gate 103 of NMOS pass transistor 100 through "native" n-channel transistor 150, whose gate 153 may be tied to $V_{DD}$ for this purpose. When $V_{CTRL}$ is set to $V_{SS}$, "native" n-channel transistor 150 passes $V_{SS}$ onto node 110, such that NMOS pass transistor 100 is in the "cutoff" state. When $V_{CTRL}$ is set to $V_{DD}$, the voltage applied on node 110 is approximately $V_{DD}$ and NMOS pass transistor 100 is in the "on" state in which it acts as a closed switch. (The voltage on node 110 is approximately $V_{DD}$ because the "native" n-channel transistor 150 has a positive threshold voltage that is close to zero volts, such that the $V_{GATE}-V_t$ limit on signal levels passed by the "native" n-channel transistor 150 is approximately $V_{DD}$.)

While in the "on" state and when $V_{IN}$ on its input terminal 101 is logic LOW, NMOS pass transistor 100 passes the logic LOW value to its output terminal 102 as $V_{OUT}$. When $V_{IN}$ on input terminal 101 changes from logic LOW to logic HIGH, the resulting gate-channel coupling boosts the voltage on gate terminal 103, which had been set to approximately $V_{DD}$ by node 110, to a voltage higher than $V_{DD}$. While the voltage on gate 103 of NMOS pass transistor 100 is thus bootstrapped above $V_{DD}$, "native" n-channel transistor 150 serves to isolate $V_{CTRL}$ on lead 151, which is at $V_{DD}$, from node 110, which is now at the higher bootstrapped voltage level that exceeds $V_{DD}$.

As a result of this bootstrapping, the effective $V_{GATE}$ of NMOS pass transistor 100 is increased, thereby raising the $V_{GATE}-V_t$ limit on the signal levels that may appear on its output terminal 102. Over time, node 110 may leak charge and return to $V_{DD}$; however, it is not necessary for the bootstrapped voltage to be maintained on gate 103 for an extended period of time: the bootstrapped voltage should be available long enough for the logic HIGH signal to be propagated through NMOS pass transistor 100 and be recognized, and preferably latched, as a logic HIGH signal by the receiving logic (e.g., an inverter, driver, buffer, etc.).

When $V_{IN}$ subsequently transitions from logic HIGH back to logic LOW, the gate-channel coupling brings node 110 below $V_{DD}$. However, this is temporary since the "native" n-channel transistor 150 drives node 110 back up to approximately $V_{DD}$ (if $V_{CTRL}$ is set to $V_{DD}$), so as to allow the next rising edge to boost $V_{GATE}$ via the above-described bootstrapping mechanism.

Although the bootstrapped $V_{GATE}$ may exceed $V_{DD}$, it is not necessary for NMOS pass transistor 100 to be a thick-oxide device because the bootstrapping occurs as a result of the dynamic coupling between the gate terminal and the channel, such that the voltage across the gate oxide is never greater than $V_{DD}$.

Figure 2:
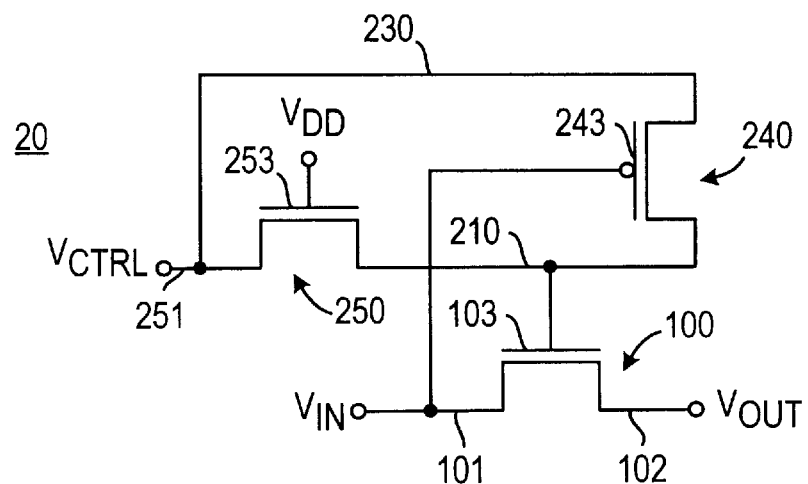
FIG. 2 is an alternative embodiment of the improved interconnection switch shown in FIG. 1.

If "native" devices, such as "native" n-channel transistor 150, are not available or cannot be used, FIG. 2 shows one possible embodiment of an alternative interconnection switch 20 which may be constructed in accordance with the principles of the present invention. Interconnection switch 20 is an alternative embodiment of the interconnection switch 10 shown in FIG. 1 that does not use a "native" n-channel transistor 150 for bootstrapping the voltage on gate 103 of NMOS pass transistor 100 and isolating it from $V_{CTRL}$. Instead, a pair of standard MOS transistors, PMOS transistor 240 and NMOS transistor 250, are used for this purpose. Because the general operation of interconnection switch 20 is similar to that of interconnection switch 10, the ensuing discussion of interconnection switch 20 will focus on their differences.

In a manner similar to "native" n-channel transistor 150 of interconnection switch 10, NMOS transistor 250 of interconnection switch 20 serves to isolate node 210 from $V_{CTRL}$ on lead 251 when node 210 is bootstrapped to a voltage that exceeds $V_{CTRL}$. However, unlike "native" n-channel transistor 150, the threshold voltage of standard NMOS transistor 250 is not close to zero. As a result, when $V_{CTRL}$ is set to $V_{DD}$, NMOS transistor 250 applies $V_{DD}-V_t$ on node 210, which, if used as the gate voltage (without bootstrapping) to turn on NMOS pass transistor 100, the $V_{GATE}-V_t$ ceiling on signals passed by NMOS pass transistor 100 would be $(V_{DD}-V_t)-V_t=V_{DD}-2V_t$. Accordingly, in the embodiment shown in FIG. 2, PMOS transistor 240 has been added to pull up node 210 to $V_{DD}$.

For interconnection switch 20, the process of bootstrapping the voltage on gate 103 of NMOS pass transistor 100 to a voltage higher than $V_{DD}$ may be illustrated as follows: when $V_{IN}$ on the input terminal 101 of NMOS pass transistor 100 is logic LOW, the voltage on node 210 is pulled up from $V_{DD}-V_t$ to $V_{DD}$ by PMOS transistor 240; when $V_{IN}$ changes from logic LOW to logic HIGH, PMOS transistor 240 turns off and node 210, which had been pulled up to $V_{DD}$ by PMOS transistor 240, is then bootstrapped to a voltage above $V_{DD}$ via gate-channel coupling, thereby allowing NMOS pass transistor 100 to pass a logic HIGH voltage that may be higher than $V_{DD}-V_t$.

Figure 3:
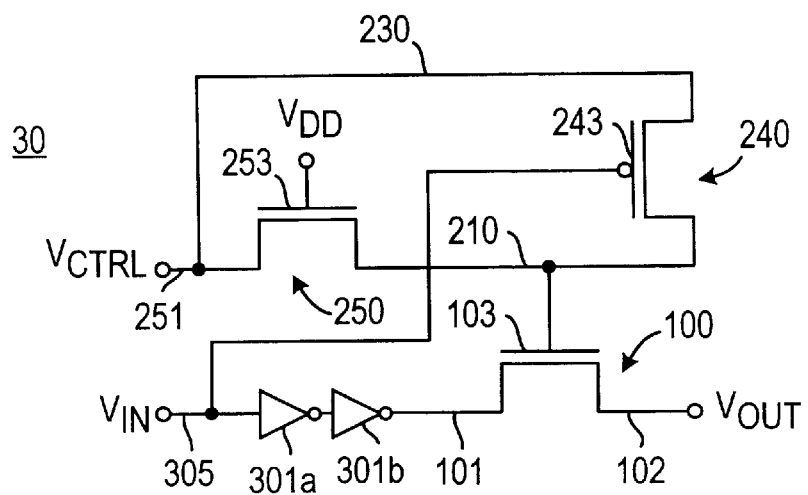
FIG. 3 is an alternative embodiment of the improved interconnection switch shown in FIG. 2.

In order to allow more bootstrapping, PMOS transistor 240 should be turned off as quickly as possible when the voltage on input terminal 101 of NMOS pass transistor 100 transitions from logic LOW to logic HIGH. One example of such an arrangement is illustrated in FIG. 3, which shows an alternative embodiment of interconnection switch 20. In the interconnection switch 30 shown in FIG. 3, an earlier signal on node 305 is used to turn off PMOS transistor 240 before the voltage on input terminal 101 of NMOS pass transistor 100 transitions from logic LOW to logic HIGH. Although FIG. 3 shows a pair of inverters 301a/b being used to introduce a signal delay between node 305 and the input terminal 101 of NMOS pass transistor 100, any suitable delaying circuit or logic may be used.

Although the foregoing discussion illustrates how the principles of the present invention may be used to improve interconnection switch designs that use NMOS passgates, similar improvements may be made to interconnection switches that use PMOS passgates in order to improve the propagation of logic LOW signals.

Figure 4:
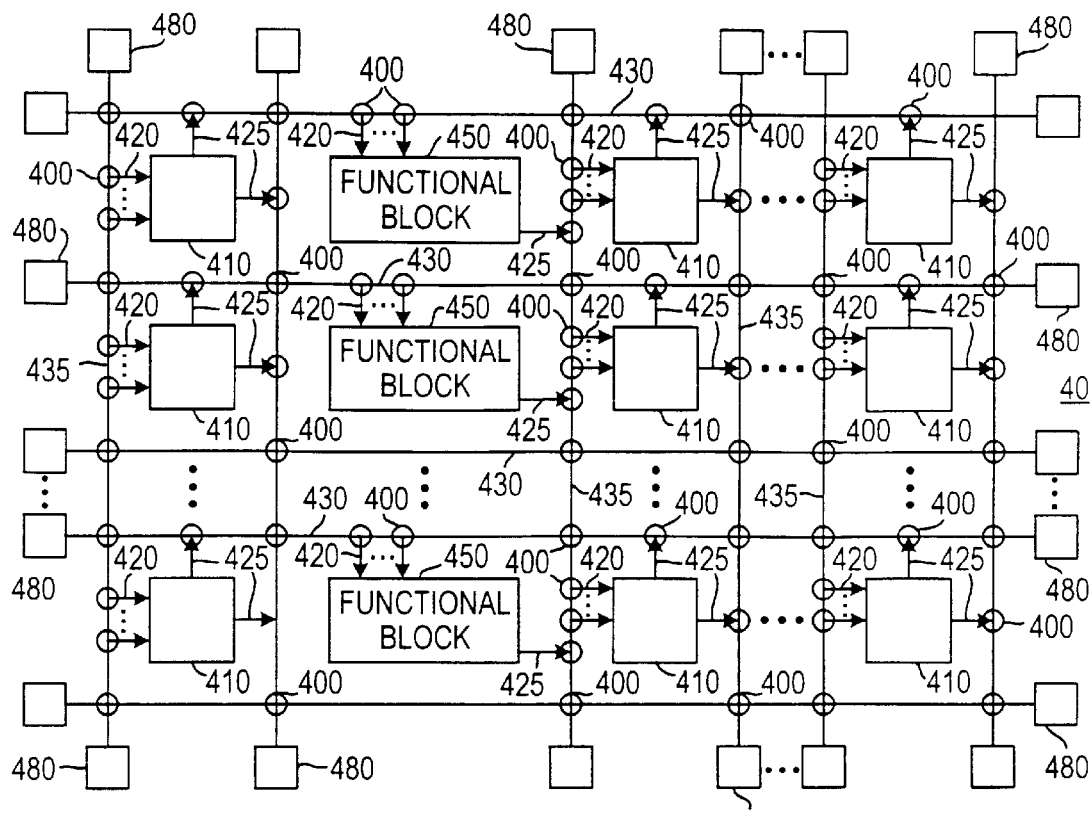
FIG. 4 is a simplified block diagram of a programmable logic device.

The above-described interconnection switches 10/20/30 that have been constructed in accordance with the principles of the present invention are especially useful in integrated circuit devices, such as programmable logic devices, in which interconnection switches are used extensively to allow programmable routing and switching. FIG. 4 is a simplified block diagram of an illustrative programmable logic device 40 in which interconnection switches that have been constructed in accordance with the principles of the present invention may be readily used. Programmable logic device 40 includes a plurality of regions of programmable logic 410 operatively disposed in a two-dimensional array of rows and columns, and a programmable network of horizontal 430 and vertical 435 interconnection conductors for conveying signals amongst the logic regions 410 and various I/O structures 480. In the network of interconnection conductors 430/435, signals may be programmably routed via interconnection switches 400. In some embodiments, programmable logic device 40 may also include any of a variety of functional blocks 450, such as memory structures, multiplier/accumulator blocks, arithmetic logic units, microprocessors, etc. Functional blocks 450 may be dedicated structures that are configured to implement a specific function, or, alternatively, they may be user-programmable/reconfigurable structures.

Figure 5:
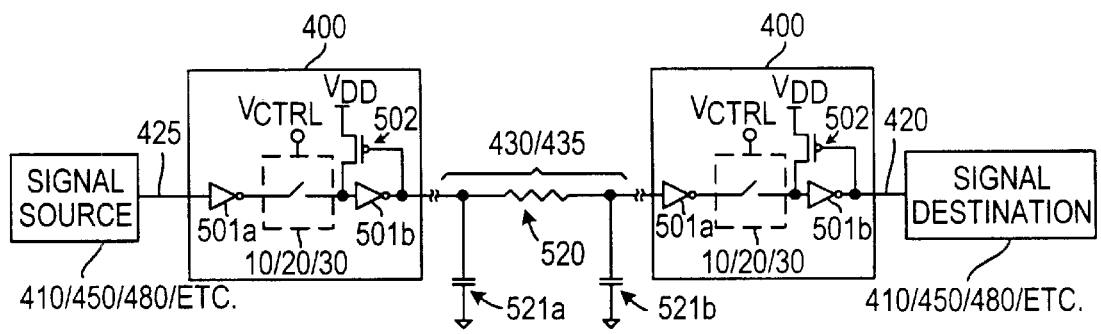
FIG. 5 illustrates how an aspect of the programmable logic device of FIG. 4 may be improved by employing any of the improved interconnection switches shown in FIGS. 1–3.

FIG. 5 illustrates in greater detail how interconnection switches 400 may be used in the network of interconnection conductors 430/435 to route signals within programmable logic device 40. For the purpose of illustrating the principles of the present invention, a signal source/destination within programmable logic device 40 may be any of the logic regions 410, functional blocks 450, I/O structures 480, or other circuitry within programmable logic device 40. As shown in FIG. 5, a signal may be routed from any given source to any given destination by using interconnection switches 400 to "switch" signals provided on the output leads 425 of signal source 410/450/480/etc. onto the network of interconnection conductors 430/435 (within which interconnection switches 400 may also be used to programmably connect one interconnection conductor to another), from which the signal may be eventually "switched onto" the input lead 420 of signal destination 410/450/480/etc. As shown in FIG. 5, the electrical characteristics of the network of interconnection conductors 430/435 may be represented as a chain of resistors 520 and capacitors 521a/b in a "black-box" abstraction.

Also shown in FIG. 5 is one embodiment of an interconnection switch 400 that may be constructed in accordance with the principles of the present invention. As illustrated in FIG. 5, interconnection switch 400 may include any of the interconnection switches 10/20/30 as the switching mechanism. In some embodiments, a pair of inverters 501a and 501b, along with a "half-latch" PMOS transistor 502, may also be included to provide buffering of the input and output signals.

Figure 6:
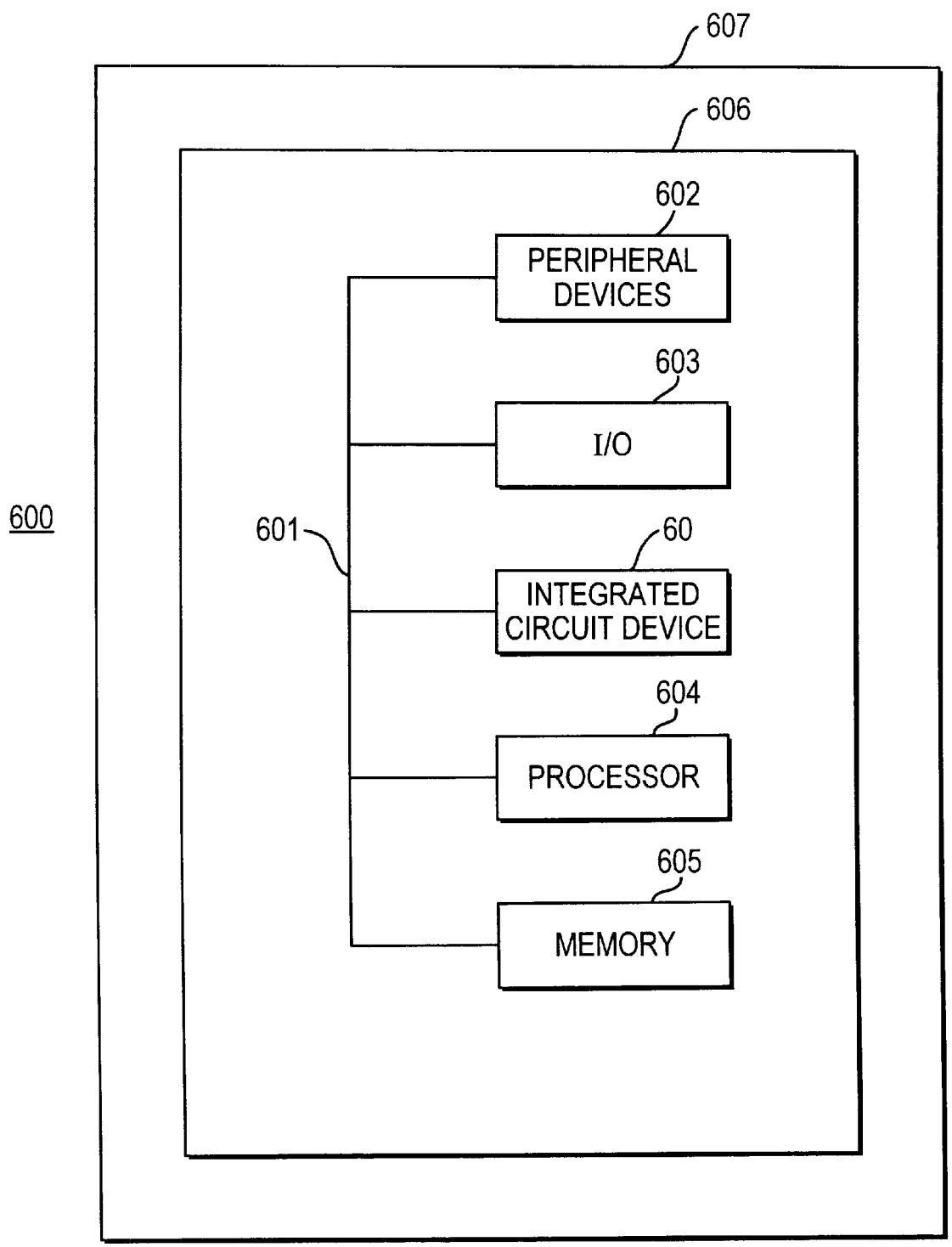
FIG. 6 is a simplified block diagram of an illustrative system that includes an integrated circuit device employing any of the improved interconnection switches shown in FIGS. 1–3.

FIG. 6 shows how an integrated circuit device 60 (e.g., a programmable logic device) employing any of the improved interconnection switch structures that have been described in the foregoing may be used in a system 600. System 600 may include one or more of the following components: various peripheral devices 602, I/O circuitry 603, a processor 604, and a memory 605. These components may be coupled together by a system bus 601 and may be populated on a circuit board 606 which is contained in an end-user system 607.

System 600 can be used in a wide variety of applications, such as computer networking, data networking, instrumentation, video processing, digital signal processing, or any other application where the advantage of using programmable or reprogrammable logic is desirable. Integrated circuit device 60, employing interconnection switch structures that have been constructed in accordance with the principles of the present invention, may be used to perform a variety of different logic functions. For example, integrated circuit device 60 can be configured as a processor or controller that works in cooperation with processor 604. Integrated circuit device 60 may also be used as an arbiter for arbitrating access to a shared resource in system 600. In yet another example, integrated circuit device 60 may be configured as an interface between processor 604 and one of the other components in system 600.

Various technologies may be used to implement the integrated circuit device 60 employing interconnection switch structures that have been constructed in accordance with the principles of the present invention. Moreover, this invention is applicable to both one-time-only programmable and reprogrammable devices.

Thus, it is seen that improved interconnection switch structures for an integrated circuit device have been presented. One skilled in the art will appreciate that the present invention may be practiced by other than the described embodiments, which are presented for purposes of illustration and not of limitation, and the present invention is limited only by the claims which follow.

What is claimed is:

1. An interconnection switch comprising:
    a passgate having associated gate, input, and output terminals; and
    bootstrapping circuitry having a first terminal and a second terminal, wherein the first terminal is configured to be connected to a control voltage source and the second terminal is coupled to the associated gate terminal of the passgate, and wherein the passgate is a MOS transistor having a first threshold voltage, and wherein the bootstrapping circuitry includes a transistor device having a second threshold voltage, wherein the first threshold voltage is different than the second threshold voltage.

2. The interconnection switch defined in claim 1, wherein the MOS transistor is an NMOS transistor, and wherein the second threshold voltage is lower than the first threshold voltage.

3. The interconnection switch defined in claim 2, wherein the transistor device is a native n-channel transistor having associated gate, input, and output terminals, and wherein the associated input terminal of the native n-channel transistor corresponds to the first terminal of the bootstrapping circuitry and the associated output terminal of the native n-channel transistor corresponds to the second terminal of the bootstrapping circuitry.

4. The interconnection switch defined in claim 3, wherein the associated gate terminal of the native n-channel transistor is configured to be connected to a static voltage source.

5. An interconnection switch comprising:
    a passgate having associated gate, input, and output terminals; and
    bootstrapping circuitry having a first terminal and a second terminal, wherein the first terminal is configured to be connected to a control voltage source and the second terminal is coupled to the associated gate terminal of the passgate, wherein the passgate is a first NMOS transistor and the bootstrapping circuitry includes a second NMOS transistor having associated gate, input, and output terminals and a PMOS transistor having associated gate, input, and output terminals, wherein the associated input terminal of the second NMOS transistor and the associated input terminal of the PMOS transistor are connected to a first electrical node that corresponds to the first terminal of the bootstrapping circuitry, and the associated output terminal of the second NMOS transistor and the associated output terminal of the PMOS transistor are connected to a second electrical node that corresponds to the second terminal of the bootstrapping circuitry, and wherein the associated gate terminal of the second NMOS transistor is configured to be connected to a static bias voltage, and wherein the associated gate terminal of the PMOS transistor is connected to a third electrical node that is configured to receive a signal to be passed through the interconnection switch.

6. The interconnection switch defined in claim 5, wherein the third electrical node corresponds to the associated input terminal of the first NMOS transistor.

7. The interconnection switch defined in claim 5, wherein a delaying circuit is coupled between the third electrical node and the associated input terminal of the first NMOS transistor.

8. An integrated circuit device including a plurality of switch structures similar to the interconnection switch defined in claim 5.

9. The integrated circuit device defined in claim 8, wherein the integrated circuit device is a programmable logic device.

10. A digital processing system comprising:

processing circuitry;

a system memory coupled to the processing circuitry; and the integrated circuit device defined in claim 9 coupled to the processing circuitry and the system memory.

11. A printed circuit board on which is mounted the integrated circuit device defined in claim 9.

12. The printed circuit board defined in claim 11 further comprising:

a board memory mounted on the printed circuit board and coupled to the integrated circuit device.

13. The printed circuit board defined in claim 12 further comprising:

processing circuitry mounted on the printed circuit board and coupled to the integrated circuit device.

14. A method of operating an interconnection switch that is responsive to a control signal provided from a control signal source and has a pass transistor with associated gate, input, and output terminals, the method comprising:

connecting a bootstrapping device between the control signal source and the associated gate of the pass transistor;

applying on the associated input terminal of the pass transistor an input signal to be passed by the interconnection switch;

propagating the control signal to the associated gate of the pass transistor by passing the control signal through the bootstrapping device; and using the bootstrapping device to isolate the control signal source from a bootstrapped voltage generated on the associated gate of the pass transistor when the input signal changes from a first logic level to a second logic level, wherein the bootstrapped voltage has an associated magnitude that exceeds that of the control signal.

15. The method defined in claim 14, wherein the pass transistor is an NMOS transistor.

16. The method defined in claim 14, wherein the first logic level is a logic LOW and the second logic level is a logic HIGH.

17. The method defined in claim 14 further comprising:

using a native n-channel transistor as the bootstrapping device.

18. The method defined in claim 17, wherein the n-channel transistor has associated gate, input, and output terminals, and wherein the associated gate terminal of the native n-channel transistor is configured to be connected to a static voltage source.

19. A method of operating an interconnection switch that includes an NMOS pass transistor having associated gate, input, and output terminals, the method comprising:

applying an initial voltage on the associated gate of the NMOS pass transistor;

providing an input voltage on the associated input terminal of the NMOS pass transistor, wherein the input voltage is indicative of a first logic level;

changing the input voltage from the first logic level to a second logic level; and isolating a bootstrapped voltage created when the changing of the input voltage boosts the initial voltage to a higher voltage via gate-channel coupling.

20. The method defined in claim 19, wherein the NMOS pass transistor is not a thick-oxide device.

21. The method defined in claim 19 further comprising:

latching an output voltage level provided on the associated output terminal of the NMOS pass transistor.

* * * * *